(12) United States Patent
Rebstock et al.

(10) Patent No.: US 12,288,697 B2
(45) Date of Patent: Apr. 29, 2025

(54) CORE MODULE FOR SEMICONDUCTOR PRODUCTION FACILITY MACHINERY

(71) Applicant: BROOKS AUTOMATION (GERMANY) GMBH, Steißlingen (DE)

(72) Inventors: Lutz Rebstock, Gaienhofen (DE); Yves Fenner, Berg (CH)

(73) Assignee: Brooks Automation (Germany), GMBH (DE)

( * ) Notice: Subject to any disclaimer, the term of this patent is extended or adjusted under 35 U.S.C. 154(b) by 382 days.

(21) Appl. No.: 17/756,938

(22) PCT Filed: Dec. 15, 2020

(86) PCT No.: PCT/EP2020/086301
§ 371 (c)(1),
(2) Date: Jun. 6, 2022

(87) PCT Pub. No.: WO2021/122654
PCT Pub. Date: Jun. 24, 2021

(65) Prior Publication Data
US 2023/0017221 A1    Jan. 19, 2023

(30) Foreign Application Priority Data

Dec. 18, 2019 (EP) .................................... 19217739

(51) Int. Cl.
*H01L 21/67* (2006.01)
*H01L 21/02* (2006.01)
*H01L 21/677* (2006.01)
(52) U.S. Cl.
CPC .. *H01L 21/67034* (2013.01); *H01L 21/02052* (2013.01); *H01L 21/67742* (2013.01)

(58) Field of Classification Search
CPC ................................................ H01L 21/67718
See application file for complete search history.

(56) References Cited

U.S. PATENT DOCUMENTS

| | | |
|---|---|---|
| 2002/0094257 A1 | 7/2002 | Babbs et al. |
| 2005/0183824 A1 | 8/2005 | Lee et al. |
| 2006/0201074 A1 | 9/2006 | Kurita et al. |
| 2009/0324367 A1 | 12/2009 | Isozaki et al. |
| 2010/0329827 A1 | 12/2010 | Hoey et al. |
| 2018/0108548 A1 | 4/2018 | Yang et al. |
| 2018/0342409 A1 | 11/2018 | Shindo |

FOREIGN PATENT DOCUMENTS

| | | |
|---|---|---|
| JP | 2010010398 | 1/2010 |
| JP | 20180133588 | 8/2018 |
| JP | 2018198305 | 12/2018 |
| KR | 1020110052462 | 5/2011 |
| KR | 1020120100249 | 9/2012 |
| KR | 1020180058464 | 6/2018 |
| TW | 200629117 | 8/2006 |
| WO | 2012176060 | 12/2012 |

OTHER PUBLICATIONS

International search report for PCT/EP2020/086301 dated Feb. 18, 2021.

*Primary Examiner* — Jason Y Ko
(74) *Attorney, Agent, or Firm* — Perman & Green, LLP

(57) ABSTRACT

The invention relates to an apparatus (200, 200A, 300, 400) for a semiconductor production facility handling an object, the apparatus comprising a core module (100) and at least one functionality module (M . . . ). A core module (100) as well as an operating method for such an apparatus are further aspects of the invention.

14 Claims, 4 Drawing Sheets

CORE MODULE FOR SEMICONDUCTOR PRODUCTION FACILITY MACHINERY

CROSS REFERENCE TO RELATED APPLICATIONS

This application is a National Stage of International Application No. PCT/EP2020/086301, having an International Filing date of 15 Dec. 2020, which designated the United States of America, and which International Application was published under PCT Article 21(2) as WO Publication 2021/122654 A1, which claims priority from and the benefit of European Patent Application No. 19217739.2 filed on 18 Dec. 2019, the disclosures of which are incorporated herein by reference in their entireties.

BACKGROUND

1. Field

The present disclosure relates to machinery and operating methods for semiconductor production facilities.

2. Brief Description of Related Developments

In semiconductor industry production facilities such as silicon wafer factories or chip foundries, automation and clean room technologies play an important role.

Traditionally, machines and devices are aligned to a transport line, along which the product travels throughout the production process or via which tools are transported from a storage location to a machine which uses and/or handles the respective tool. Usually every machine and device fulfils a very specific function in the context of the production process.

Conventionally, the length of the transport line is limited and every machine and device is required to fit into a predefined allotted amount of space along the transport line. Particularly, the machines and devices are therefore designed to take up as little space as possible adjacent to the transport line. At the same time, they can have larger dimensions in a direction perpendicularly pointing away from the transport line, horizontally as well as vertically.

SUMMARY

In view of the above, the present disclosure provides a novel possibility of providing additional functionality to an existing production facility. The present disclosure can also be used for new facilities with respective benefits as described below.

According to the present disclosure, a core module and an apparatus for semiconductor production facilities as well as a method for operating the same with the features of the independent claims are proposed. Advantageous aspects are the subject-matter of the dependent claims and the following description.

According to the present disclosure, a core module for semiconductor production facility machinery is provided, comprising a handler, a supply unit and a control unit. The supply unit provides media such as purging gases, hydraulic and/or pneumatic driving fluids and/or cleaning fluids and electric energy to the handler and the control unit controls the handler. The core module also comprises a housing comprising a plurality of interface frames. Each interface frame is attachable to and detachable from at least one other of the plurality of interface frames, so that the housing can be enlarged by adding additional interface frames or decreased in size by detaching one or more of them. This provides for flexibility to adjust to varying space requirements depending on the various functionalities to be provided. Each of the interface frames is configured to hold or accommodate a blind panel or a functionality module. The supply unit is connectable to each or at least one of the plurality of interface frames and the control unit is configured to control each or at least one functionality module, accommodated with or held by one of the plurality of interface frames. Thereby it is possible to modify the core module so as to provide a desired functionality or a plurality of functionalities. An attached functionality module can, thus, be connected to the supply and control units via the respective interface frame.

As such the core module provides a hardware platform for a modular machine which can be tailored to the specific requirements of the semiconductor production facility by combining respective functionality modules.

Preferably, the housing is configured to seal an internal volume of the core module, in which at least the handler is located, from the atmosphere surrounding the core module in a substantially gas tight manner. Particularly, this sealing functionality of the housing may prevent any, certain or all constituents, especially particulate constituents, of the surrounding atmosphere from entering the internal volume in an amount exceeding e.g. 1 mole per year, 1 mole per day or 1 mole per hour. Preferably, the quality of the sealing functionality of the housing is independent of whether a functionality module or a blind panel is attached to a respective interface frame. It is, however, to be understood that the quality of the sealing functionality might be dependent on the number of interface frames present in the housing, since every joint between two interface frames increases the potential for leaks.

Preferably, the lateral size of each interface frame corresponds to an integral or whole-numbered multiple of a predefined basic frame size. This provides the advantage, that an essentially arbitrary number of interface frames can be attached to one another without providing additional compensatory elements, while for example maintaining a rectangular overall layout of the housing.

Preferably the housing has an overall rectangular layout, in order to fit into an allotted location in the semiconductor production facility.

Advantageously, several or all of the interface frames are identical in size and shape, thereby further facilitating the combinability of a desired number of interface frames in one housing. This also facilitates combining different functionalities in one device, since the arrangement of different functionality modules with respect to one another can be chosen arbitrarily.

In advantageous aspects, the handler comprises a terminal manipulator and a robotic element. The robotic element may, for example, be a six-axes robotic arm, a four-axes robotic arm, a SCARA (short for Selective Compliance Assembly Robot Arm or Selective Compliance Articulated Robot Arm) or a wafer engine (a robot configuration marketed by Brooks Automation) type robot. The terminal manipulator is preferably attached or attachable to and/or detachable from the robotic element and configured to mechanically interact with an object to be handled.

Advantageously, the core module comprises a uniaxial track supporting the handler. The handler is preferably moveable along the track and this movement is controlled by the control unit. This provides the advantage that small (and therefore less capital intensive) handlers can be utilized for handling objects even when many functionality modules are provided with the core module. This also minimizes the spatial footprint of the handler and, therefore, the whole core module. In such a case it is particularly preferred for the plurality of interface frames to be arranged essentially parallel to the uniaxial track, so that the functionality modules can be easily reached by the handler.

The core module advantageously further comprises means for providing a laminar flow of a purging gas, particularly an inert gas such as nitrogen. This laminar flow of the purging gas preferably flows vertically downwards through substantially the entire volume of the core module, in order to assist particle sedimentation and prevent cross contamination from one handled object to another object handled at a later time within the same core module. This means for providing the laminar flow may, for example, be provided in a ceiling of the core module, comprise a gas diffusor and/or may be connected to the supply unit and/or the control unit of the core module.

In advantageous aspects, the object to be handled comprises a reticle (a photomask for photolithographic semiconductor manufacturing processes), a reticle container such as an EIP (EUV Inner Pod) or an EOP (EUV outer Pod), an EIP component, an EOP component, an EIP clamp, an RSP 200, an RSP 150 (transport or shipping containers for reticles), a wafer, a wafer container or a combination of at least two thereof.

According to one aspect of the present disclosure, an apparatus comprising such a core module and at least one functionality module is provided.

Preferably the functionality of the at least one functionality module includes one or more of opening, closing, packaging, storing, cleaning, inspecting, registering, assembling and purging the object, applying media to the object and writing and/or reading information from the object.

In another aspect, a method of operating such an apparatus is provided, comprising the steps of identifying the at least one functionality module, identifying the object, determining a starting position of the handler, controlling the handler to handle the object and controlling the at least one functionality module to perform its function. According to the present disclosure, the step of controlling the handler comprises controlling the handler to move towards the object, mechanically interact with the object and transfer the object to the at least one functionality module.

Further advantages and aspects of the present disclosure are described in the following with reference to the accompanying drawings.

It will be understood that the features mentioned above and/or discussed in the following are not only usable in the specifically described combinations, but can also be differently combined or used in isolation without departing from the scope of the present disclosure.

The present disclosure is schematically illustrated in the accompanying drawings in the form of exemplary advantageous aspects and described in the following with reference to these drawings.

BRIEF DESCRIPTION OF THE RELATED DRAWINGS

Figure 4:
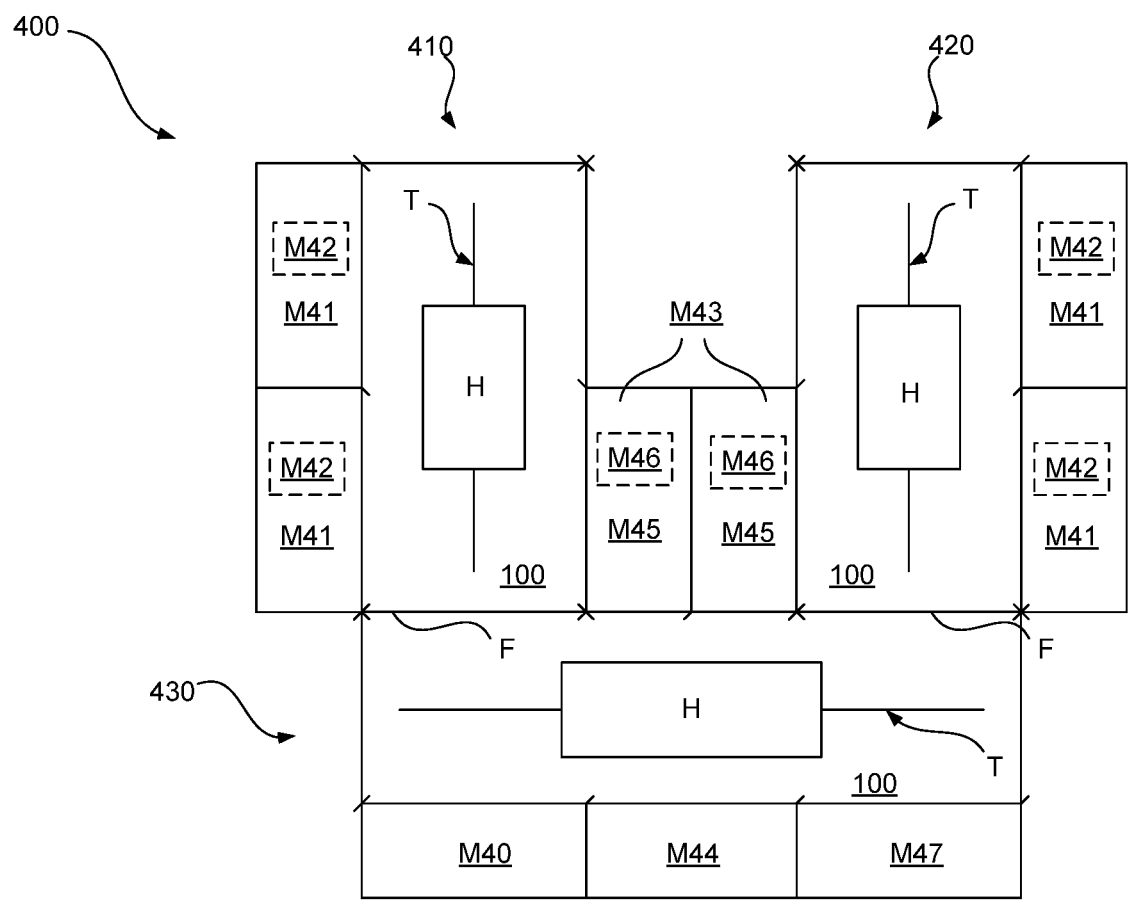

FIG. 4 schematically illustrates a further aspect of an apparatus according to the present disclosure comprising three core modules and several functionality modules.

DETAILED DESCRIPTION

Figure 1:
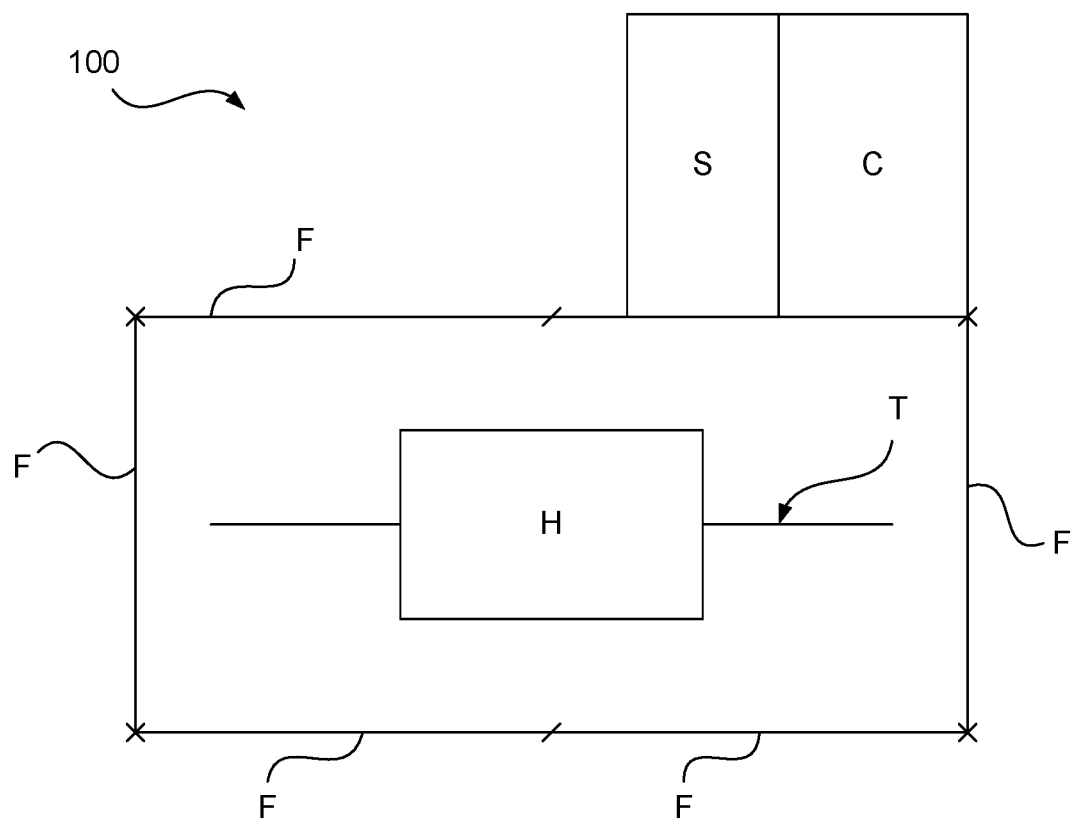
FIG. 1 shows a strongly simplified schematic drawing of an aspect of a core module according to the present disclosure

In FIG. 1, a core module 100 is illustrated in a schematic plan view. The core module 100 comprises a handler H, a supply unit S, a control unit C and several interface frames or frame elements F. The interface frames F form the main part of the core module's 100 housing and are arranged in such a manner that the inner volume of the core module 100, in which the handler H is located, has a rectangular layout.

A track T is provided within the housing of the core module 100 and positioned to be aligned in parallel with a longitudinal axis of the core module's 100 housing. The handler H is provided on the track T and is moveable in the direction of the longitudinal axis along the track T. The handler H may comprise, for example, a robotic element, e.g. a six-axes robotic arm, and a terminal manipulator, for example a gripper, or a plurality of grippers.

The supply unit S is connected with the handler H and provides media such as purging gas(es) or pneumatic and/or hydraulic driving fluids and/or electric power to the handler H. For example, the robotic arm may be powered electrically or pneumatically, and depending on the source of motion energy employed by the handler H, the supply unit S provides resources accordingly.

The control unit C is in communicating connection with the handler H and controls the handler H. For example, the control unit C can be provided in the form of a microcontroller or computer. It may send electronic signals to the robotic arm via dedicated wiring or through a wireless connection to control the movement of handler H.

Figure 2:
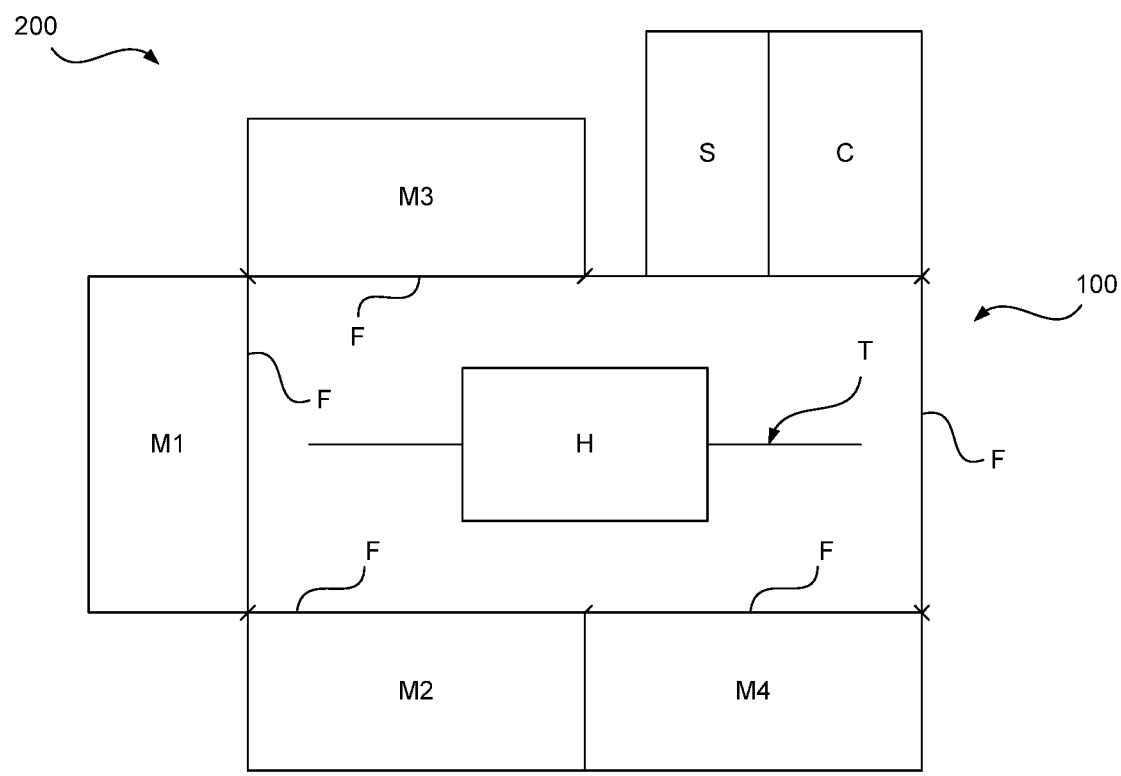
FIG. 2 shows an aspect of an apparatus according to the present disclosure comprising a core module and several functionality modules.

With reference to FIG. 2, an apparatus 200 comprising the above described core module 100 and four functionality modules M1 to M4 is schematically depicted.

Each of the functionality modules M1 to M4 may provide a different functionality.

First Aspect

For example, functionality module M1 may be a load port for transferring an object from outside the apparatus 200 into the apparatus 200. This transfer is controlled by the control unit C of the core module 100.

The handler H may then be controlled to move towards the load port M1 along the track T and take over the object from the load port M1.

The handler H may further be controlled by the control unit C to transfer the object to the functionality module M2, which may be, for example, an inspection module for inspecting the object, e.g. optically.

The object is then inspected by the inspection module M2. In this example a camera and illumination system may be provided with the inspection module M2. Images of the object obtained during this inspection may be compared to images of a reference object of the same type in order to detect deviations. The reference images may be stored in the inspection module M2 or in the control unit C or may also be provided from outside the apparatus 200.

If deviations between the inspected object and the reference object of a predefined magnitude are detected by the inspection module M2, the inspected object may be transferred by the handler H to a third functionality module M3, which, in this aspect, is a cleaning module.

In the cleaning module M3, the object is cleaned, for example, in order to remove particulate contaminants which led to the deviation detected by the inspection module M2. In some aspects, the inspection module M2 might have mapped the locations on the object in which deviations between the inspected and reference objects occurred so that the cleaning module M3 can be controlled by the control unit C to decontaminate those locations, particularly.

After the cleaning module M3 finishes cleaning the object, the handler H may transfer the object back to the inspection module M2, where the result of the cleaning procedure can be assessed in the same manner as described above.

In the opposite case, when deviations between the inspected object and the reference object do not exceed the predefined threshold, the handler H may transfer the object to the fourth functionality module M4 which may be a storage module. This may also be the case for objects which the inspection module M2 deems clean after a decontamination treatment by the cleaning module M3.

A sufficiently clean object may, thus, be stored in the storage module M4 without undergoing any cleaning procedure, while objects requiring decontamination treatment are not transferred to the storage module M4 until sufficient cleanness is achieved. This provides several advantages such as time saving, when e.g. not all the objects are cleaned before storing; decrease of wear, since every cleaning may cause mechanical or chemical stress to the object; and decrease of cross-contamination, as only substantially clean objects are stored in the storage module M4.

Particularly advantageous aspects enable the apparatus 200 to treat several objects simultaneously. For example, when a first object is being cleaned in the cleaning module M3, a second object may be retrieved from the storage module M4. The handler H will typically not be needed for cleaning the first object, so it is idle during the cleaning procedure and can therefore be used to transport the second object from the storage module M4 to the load port M1.

Another possibility for such simultaneous handling may be that a first object is cleaned in the cleaning module M3 while a second object is inspected by the inspection module M2. If the second object is deemed to be sufficiently clean, it can be moved to the storage module M4 by the handler H, before the first object is transferred back to the inspection module M3 for assessment of the cleaning result.

If, by contrast, the second object is also deemed to require cleaning treatment, while the first object is in the cleaning module M3, one of the objects must be removed from its respective functionality module M2, M3 and "parked" in a parking position, so that the other object can be moved to the respective functionality module M3, M2. For example, the first object may be removed from the cleaning module M3 after the cleaning procedure has finished. it cannot be transferred to the inspection module M2 directly, because that is still occupied by the second object. Therefore, the first object may be moved to a parking position, e.g. the load port M1, by the handler H. The handler H then transports the second object from the inspection module M2 to the cleaning module M3 and subsequently the first object from the parking position (in this example the load port M1) to the inspection module M2.

Since all operations of the handler H and the functionality modules M1 to M4 are controlled by the control unit C, it is possible to use any of the functionality modules as the parking position for such transfers.

Second Aspect

Figure 2A:
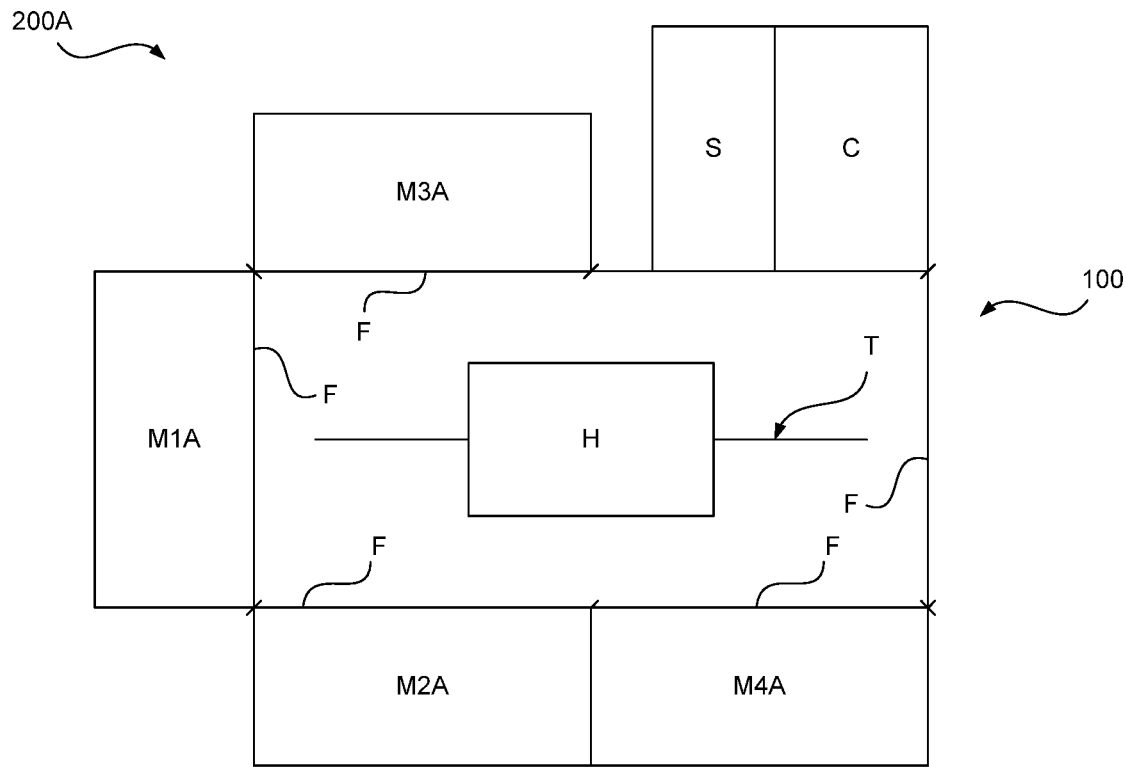
FIG. 2A shows a further aspect of an apparatus according to the present disclosure comprising a core module and several functionality modules.

A second aspect of an apparatus 200A according to the present disclosure is described with reference to FIG. 2A.

In this aspect, the apparatus 200A is provided with different functionality modules in comparison to the first aspect. For example, a receiving module M4A for receiving reticle shipping boxes is provided. A box handling module M2A is configured to open and close reticle transport boxes and a pod assembling module M3A is provided to assemble reticle double pods from their respective basic components as described in further detail below. A load port M1A is provided to transfer such double pods to and from outside the apparatus 200A, for example to and from a transport line which is in communication with an external terminal of the load port M1A.

A reticle in the context of this disclosure may be understood as a photomask for a photolithographic process utilized for structuring semiconducting substrates such as silicon wafers to produce integrated circuits in the substrate material. Since these reticles are structured on a length scale of only several nanometers, they are costly to produce and of delicate stability. Therefore, special shipping boxes are used to transfer them safely from one factory to another and special containers, called pods, are used to transport them within the production facility itself. The shipping boxes usually differ from the pods used within the production facility. In the case of the photolithographic process using extreme ultraviolet (EUV) light for irradiating the substrate to be structured, the pods utilized are usually double pods consisting of an inner pod (EIP) and an outer pod (EOP). The reticle is accommodated within the EIP and the EIP is entirely surrounded by the EOP. Both the EIP and the EOP comprise two components, one upper and one lower component, each. The reticle and the EIP components are immobilized relative to one another through the interaction of the EOP with the EIP in order to prevent abrasion and thereby particle contamination of the reticle.

In order to provide reticles to the production facility, the apparatus 200A of this second aspect can be used. A reticle contained within a shipping box may be received at an outer terminal by the receiving module M4A. The receiving module M4A transfers the shipping box into the inner volume of the apparatus 200A, e.g. through an airlock in which the shipping box may be purged with a purging fluid or gas such as nitrogen. The handler H transfers the shipping box from the receiving module M4A to the box handling module M2A, where the box is opened. Since the shipping box has a substantially different shape and material in comparison to the reticle contained within it, a different terminal manipulator of the handler H might be necessary for the handling of the reticle than for the handling of the shipping box.

The handler H may therefore be equipped with several different terminal manipulators, each of which is adapted to handling a different type of object. For example, the handler may be equipped with three different terminal manipulators: a first one for handling shipping boxes, a second one for handling bare reticles and a third one for handling double pods.

The handler H may, thus, using the second terminal manipulator, move the bare reticle previously contained within the reticle shipping box from the box handling module M2A to the pod assembling module M3A. The pod assembling module M3A then assembles a double pod around the reticle. For example, the two lower components of the EOP and the EIP respectively may be provided with the pod assembling module M3A before the handler H delivers the bare reticle. The reticle is then placed into the lower component of the EIP and the upper components of the EIP and the EOP are attached to the respective lower components by the pod assembling module M3A. The double pod assembled in this way may then be moved by the handler H using its third terminal manipulator to the load port M1A, which transfers the double pod, e.g. through an airlock, to an outer terminal of the load port M1A. The double pod may then be collected from the outer terminal of the load port M1A by the above mentioned transport line, which in this aspect does not form part of the apparatus 200A.

It is also possible, that the different terminal manipulators are not permanently attached to the robotic arm of the handler H, but are, for example, provided in a manipulator stocker, which may be an additional module mounted to one of the interface frames F of the core module 100. In such a case, the handler, after delivering the shipping box to the box handling module M2A, moves its terminal manipulator to the manipulator stocker, where the first manipulator is detached from the robotic arm of the handler H and stored within the manipulator stocking module. The second terminal manipulator is then attached to the robotic arm of the handler H by the manipulator stocking module in order to enable the handler H to handle bare reticles.

The handler H subsequently transfers the bare reticle from the box handling module M2A to the pod assembling module M3A and returns to the manipulator stocking module to exchange the second terminal manipulator for the third one. With the then equipped third terminal manipulator, the handler H collects the double pod assembled by the pod assembling module M3A and transfers it to the load port M1A. This alternative aspect using exchangeable terminal manipulators provides the advantage that less weight needs to be supported by the robotic arm of the handler H, which can therefore be designed smaller with the usual benefits of reduced cost and higher operating precision.

The same apparatus 200A of the second aspect can also be used in the opposite direction to receive a reticle from within the production facility, retrieve it from the double pod in which it is contained and box it in a shipping box to transfer it to a different factory, for example.

Third Aspect

Figure 3:
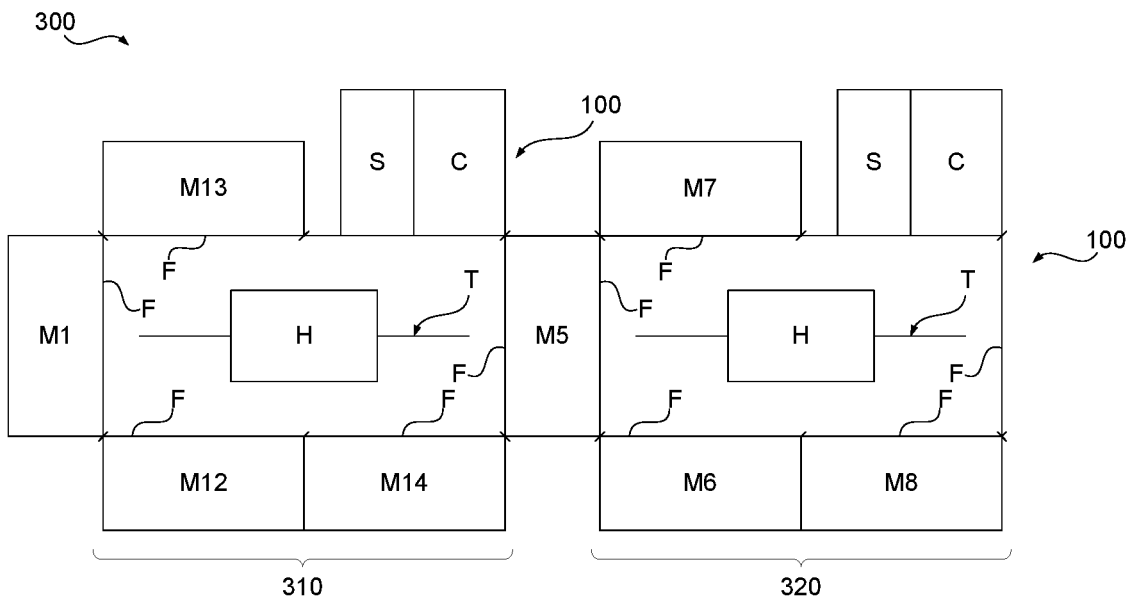
FIG. 3 shows a further aspect of an apparatus according to the present disclosure comprising two core modules and several functionality modules.

A third aspect of an apparatus 300 according to the present disclosure is described referring to FIG. 3. The apparatus 300 of this aspect is a cleaning apparatus 300 for cleaning double pods and comprises an outer pod or EOP cleaner 310 and an inner pod or EIP cleaner 320, each of which comprise one core module 100 as described above. The two core modules 100 are connected to one another through one of the functionality modules MS, which is attached to one interface frame 100 of each of the two core modules 100.

One functionality module M1 of the EOP cleaner 310 is a load port which may be essentially the same as in the second aspect and is configured to receive double pods as described above. In this particular aspect, a double pod received at the load port M1 is empty (does not contain a reticle). The handler H of the core module 100 of the EOP cleaner 310 at which the load port M1 is provided transfers the double pod from the load port M1 to the functionality module M5, which is a separation module with similar functionality as the pod assembling module M3 of the second aspect.

In the separation module M5, the double pod is disassembled or opened, so that upper and lower EOP components are separable from upper and lower EIP components. The handler H of the EOP cleaner 310 moves the EOP components to an upper EOP component cleaning module M12 and a lower EOP component cleaning module M13, respectively, where the EOP components are cleaned by the respective module M12, M13. An EOP inspection module M14 may be additionally provided to assess the result of the EOP cleaning procedure.

The upper and lower EIP components are consecutively moved to respective upper M7 and lower M8 EIP component cleaning modules which form part of the EIP cleaner 320 by the EIP cleaner's 320 handler H. The upper EIP component cleaning module M7 then cleans the upper EIP component and the lower EIP component cleaner cleans the lower EIP component. An EIP inspection module M6 may be provided with similar functionality as described above referring to the EOP inspection module M14.

Once a particular component is deemed clean by the respective inspection module M6, M14, it is returned to the separation module MS, where the double pod is reassembled, once all the components are returned. The reassembled double pod comprising an EIP contained within an EOP is returned to the load port M1 attached to the EOP cleaner 310, where the double pod is transferred to an outside terminal of the load port M1, for example through an airlock.

It is to be noted that the handler H of the EIP cleaner 320 may be configured to support substantially less weight than the handler H of the EOP cleaner 310, since it only needs to handle single components of the EIP, whereas the handler H of the EOP cleaner 310 in this third aspect must be configured to carry the weight of an entire double pod.

One important advantage of the described configuration of the double pod cleaning apparatus 300 is that the EIP components, which usually are substantially cleaner than the EOP, are handled by a dedicated handler H of the EIP cleaner 320.

Thereby, cross contamination from the outer surface of the EOP to the EIP is effectively prevented.

An alternative for this apparatus 300 according to the third aspect may be provided with an additional reticle storing module, where reticles contained within the double pod prior to cleaning may be stored during the pod cleaning procedure. This reticle storing module is advantageously provided with the EIP cleaner 320, as the internal environment of the EIP cleaner 320 is substantially less contaminated, especially with particles, than the internal environment of the EOP cleaner 310. By providing such a reticle storing module with the cleaning apparatus 300, double pods containing a reticle may also be cleaned. It is also possible to further integrate a reticle cleaner into the cleaning apparatus 300, which is advantageous because freshly cleaned reticles would then be returned to also freshly cleaned double pods, thus further improving the overall cleanness of the respective components.

Fourth Aspect

Another setup for a double pod cleaning apparatus 400 will now be described in detail with reference to FIG. 4.

Similar to the apparatus 300, double pod cleaning apparatus 400 comprises an EOP cleaner 410 and an EIP cleaner 420, each comprising a core module 100 with a handler H. The handlers H of the EOP 410 and EIP 420 cleaners are optionally moveable on a track T. A track T may not be necessary in cases where the handler H is configured to reach all the relevant areas of the respective cleaner 410, 420 without lateral movement. For example, handlers H may advantageously be configured for rotational movement about a stationary vertical axis. This is particularly advantageous as lateral movements of robotic devices are generally slow in comparison to rotational movements.

The double pod cleaner 400 further comprises an assembler 430 with a further core module 100 and handler H supported on a linear track T. The assembler 430 is provided with a receiving load port M40, an assembly station M44 and an exit load port M47.

In operation, an arriving double pod is received at the receiving load port M40, which comprises an airlock. The double pod is passed through the airlock of receiving load port M40 and moved to the assembly station M44 by the handler H. At the assembly station M44, the functionality of which essentially corresponds to that of the separation module MS described above, the double pod is opened and EOP components are transferred to the EOP cleaner 410, while the EIP is transferred to the EIP cleaner 420.

Particularly, after opening the double pod, the upper EOP component is transferred to the EOP cleaner 410. Subsequently, the EIP is transferred to the EIP cleaner 420, preferably as a whole, so that the inside of the EIP is not exposed to the relatively contaminated atmosphere of the assembler 430. Finally, the lower component of the EOP is transferred to the EOP cleaner 410.

The transfer of the EOP components and the EIP to the respective cleaners 410, 420 can, for example, be performed via respective transfer modules M43 or by a hand-over procedure in which the handler H of the assembler 430 transports the respective object to be transferred to the respective interface frame F, at which the assembler is connected to the respective cleaner 410, 420. At the respective interface frame F, the handler H of the respective cleaner collects the respective object from the handler H of the assembler 430. The latter is particularly favorable in terms of space requirement, but necessitates careful synchronization of the involved handlers H, whereas the former is more flexible regarding the timing of operation of the handlers H.

Each cleaner 410, 420 comprises an entry buffer M45 for temporarily storing uncleaned EOP or EIP components, respectively. In some aspects, the entry buffers M45 may also function as transfer modules M43. In such aspects, the handler H of the assembler 430 may deliver the respective object to be cleaned directly to the respective entry buffer M45.

Each cleaner 410, 420 is provided with at least one cleaning module M41 and at least one drying module M42. In the example shown, the drying modules M42 are positioned above the cleaning modules M41, thereby reducing the overall lateral spatial footprint of the apparatus 400. The cleaning module M41 may, for example, comprise means for mechanical particle removal and/or for providing a fluid jet. The fluid may be provided, for example, in the form of a liquid such as deionized water or an organic solvent and/or in the form of a gas like nitrogen, carbon dioxide or purified air (e.g. so-called "extreme clean dry air" (XCDA)). Mechanical cleaning means may e.g. comprise brushes, wipers or a so-called "sticky finger". The drying module M42 may be operated under vacuum or reduced pressure, for example, at an absolute pressure in the range of 1 kPa to 90 kPa, particularly between 10 kPa and 50 kPa, e.g. at about 25 kPa. The drying module M42 may further comprise heating means such as an infrared light source or a convection heater configured to heat an internal atmosphere of the drying module M42 and/or the cleaned object to a temperature in the range of 30° C. to 120° C., especially between 50° C. and 90° C., e.g. approximately 65° C. Preferably, the temperature and/or pressure in the drying module M42 are controlled, e.g. in a closed feedback loop. Advantageously, a dryness parameter is also monitored in order to determine when an object is sufficiently dry for removal from the drying module M42.

Each of the cleaners 410, 420 further comprises at least one exit buffer M46 for temporarily storing clean EOP or EIP components, respectively. Especially in cases where the entry buffer M45 is used as the transfer module M43, it is advantageous to position the exit buffer M46 above or below the entry buffer M45, as indicated in FIG. 4. Thus, the transfer module M43 may comprise an entry buffer M45 and an exit buffer M46. This provides the advantage that clean EIPs and EOP components are stored in a storage area, in which no uncleaned components are handled. Thereby, cross contamination from uncleaned to already cleaned objects is effectively prevented.

Operation of the two cleaners 410, 420 can be provided in an essentially identical manner. The handler H moves an uncleaned object, i.e. an EOP or EIP component from the entry buffer M45 to one of the at least one cleaning module M41. The respective object is then cleaned in the cleaning module M41 and afterwards transferred to the drying module M42 using the handler H. When the object is sufficiently dry, the handler H collects the clean and dry component from the cleaning module M42 and transfers it to an exit buffer M46 where the object is stored until all of the components necessary for reassembling the double pod are clean and dried.

Once all the components needed for reassembly of a double pod are available in the respective exit buffers M46, the handler H of the assembler 430 collects the lower component of the EOP from the exit buffer M46 of the EOP cleaner 410 and transfers it to the assembly station M44. The handler H then collects the EIP from the exit buffer M46 of the EIP cleaner 420 and places it onto the lower component of the EOP in the assembly station M44. Finally, the handler collects the upper component of the EOP from the exit buffer M46 of the EOP cleaner 410 and closes the double pod placing the upper component onto the lower component and attaching the two components of the EOP to one another. The assembled clean double pod is then transferred to the exit load port M47 through which it leaves the cleaning apparatus 400, preferably through another airlock provided with the exit load port M47.

It should be noted that a typical EOP weighs approximately 1.5 kg and a typical EIP weighs approximately 1 kg. Therefore, the handler H of the assembler should be configured to be capable of lifting at least 2.5 kg of weight. The handlers H of the respective cleaners 410, 420, in contrast, may be capable of lifting only a fraction of that, since they are only required to simultaneously lift only one component of an EOP or EIP, respectively. It is therefore typically not required for the handler H of the EIP cleaner 420 to be capable of lifting more than about 0.6 kg, while the handler H of the EOP cleaner should be capable of lifting around 0.75 kg of weight. However, both handlers H of the cleaners 410, 420 need to perform much more complex movements than the handler H of the assembler 430. Therefore, it may be necessary for the handlers H of the cleaners 410, 420 to be provided with six axes or degrees of freedom, each, while the handler H of the assembler can be provided in the form of a three-axes-robot.

The EIP may be pre-assembled in the exit buffer M46 after drying of its components, so that the handler H of the assembler 430 can collect the EIP as a whole so as to prevent contamination of the EIP's inner volume. This can be accomplished relatively easily since assembling an EIP from its components typically involves no locking or fixing and comprises only placing the upper component onto the lower component.

As described, for example, in connection with the second aspect, the handlers H may be provided with several interchangeable terminal manipulators, each of which is adapted to a specific task the respective handler H needs to carry out.

As mentioned above, many of the above described features may also be advantageous in different combinations or in isolation. Particularly, the different functionality modules described with reference to particular aspects can be combined with one another to form further advantageous aspects without departing from the concept of the present disclosure.

In the following claims, the reference "M . . . ." is meant to refer to any of the functionality modules M1 through M47. Citing every single one of these was avoided for the sake of readability.

In connection with all aspects described above, it is noted that during an initial set up of any of the apparatuses, it would be possible to provide blind panels in place of some of the functionality models M . . . . A corresponding apparatus could be upgraded at a later time by removing said blind panel and adding a desired functionality module in its stead.

It is also to be noted, that the interface frames F are not necessarily all provided on the same horizontal level, but could also be provided in several levels stacked one above the other so as to use more vertical space. In such aspects, the handler H or the track T supporting the handler H may be supported on an elevating element in order to reach the respective functionality modules on the upper levels.

What is claimed is:

1. A core module for semiconductor production facility machinery, the core module comprising
   a supply unit,
   a control unit,
   a handler controlled by the control unit, and
   a plurality of rectangular interface frames, each interface frame being
      attachable to and detachable from at least one further of the plurality of interface frames, and
      configured to accommodate or hold a blind panel or a functionality module,
   wherein the supply unit is connectable to each or at least one of the plurality of interface frames to provide media and electric energy to a respective functionality module, and
   the control unit is configured to control every one or at least one of the functionality modules accommodated with or held by one of the plurality of interface frames.

2. The core module according to claim 1, wherein an internal volume of the core module, in which at least the handler is located, is sealed against the atmosphere surrounding the core module.

3. The core module according to claim 1, wherein the lateral size of each interface frame corresponds to an integral multiple of a predefined basic frame size.

4. The core module according to claim 1, wherein several or all of the plurality of interface frames are identical to one another in size and shape.

5. The core module according to claim 1, wherein the handler comprises a terminal manipulator and a robotic element selected from the group of a six-axes robotic arm, a four-axes robotic arm, a SCARA and a wafer engine, wherein the terminal manipulator is attachable to and/or detachable from the robotic element and configured to mechanically interact with an object to be handled.

6. The core module according to claim 5, wherein the object to be handled comprises one or more of a reticle, a reticle container, a semiconductor chip, a wafer and/or a wafer container, or components thereof.

7. The core module according to claim 1, further comprising a uniaxial track configured to support the handler, the handler being moveable along the track and the control unit being configured to control the movement of the handler along the track.

8. The core module according to claim 1, wherein the plurality of interface frames are arranged in such a way that a housing of the core module is formed, having a generally rectangular layout.

9. The core module according to claim 1, further comprising purging means configured to provide a laminar flow of gas through the inner volume of the core module, preferably wherein the purging means is connected to the supply unit and/or the control unit.

10. An apparatus for handling an object, comprising at least one core module according to claim 1 and at least one functionality module.

11. The apparatus according to claim 10, wherein the at least one functionality module is configured to provide treatment of the object, wherein the treatment comprises one or more of opening, closing, packaging, storing, cleaning, inspecting, registering, assembling, purging, applying media and writing and/or reading information.

12. The apparatus according to claim 10, wherein the at least one functionality module comprises at least one cleaning module configured to clean components of a double pod reticle container, particularly with an inner pod cleaning module configured to clean, and optionally dry, components of an inner pod of the double pod and/or an outer pod cleaning module configured to clean, and optionally dry, components of an outer pod of the double pod.

13. The apparatus according to claim 12, comprising first and second core modules, wherein the outer pod cleaning module is arranged at interface frames of the first core module and the inner pod cleaning module is arranged at interface frames of the second core module, wherein a load port is arranged at an interface frame of the first core module.

14. A method of operating the apparatus according to claim 10, comprising the steps of:
   providing and identifying an object to be handled,
   identifying at least one functionality module to provide treatment of the object,
   determining a starting position of the handler,
   controlling the handler to handle the object, and
   controlling the at least one functionality module to provide the treatment,
   wherein the step of controlling the handler comprises controlling the handler to:
      move towards the object,
      mechanically interact with the object, and transfer the object to the at least one functionality module.

\* \* \* \* \*